US010139740B2

(12) United States Patent
Bijnen et al.

(10) Patent No.: US 10,139,740 B2
(45) Date of Patent: Nov. 27, 2018

(54) LITHOGRAPHIC APPARATUS AND DEVICE MANUFACTURING METHOD

(71) Applicant: ASML NETHERLANDS B.V., Veldhoven (NL)

(72) Inventors: Franciscus Godefridus Casper Bijnen, Valkenswaard (NL); Edo Maria Hulsebos, Waarle (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/742,028

(22) PCT Filed: Jul. 7, 2016

(86) PCT No.: PCT/EP2016/066109
§ 371 (c)(1),
(2) Date: Jan. 4, 2018

(87) PCT Pub. No.: WO2017/009166
PCT Pub. Date: Jan. 19, 2017

(65) Prior Publication Data
US 2018/0196363 A1 Jul. 12, 2018

(30) Foreign Application Priority Data
Jul. 16, 2015 (EP) ..................... 15177117

(51) Int. Cl.
*G03F 9/00* (2006.01)
*G03F 7/20* (2006.01)
(52) U.S. Cl.
CPC ............ *G03F 9/7046* (2013.01); *G03F 7/705* (2013.01); *G03F 7/70258* (2013.01);
(Continued)

(58) Field of Classification Search
CPC .... G03F 7/70258; G03F 7/705; G03F 9/7046; G03F 9/7069; G03F 9/7073; G03F 9/7088
See application file for complete search history.

(56) References Cited

U.S. PATENT DOCUMENTS 4,734,746 A * 3/1988 Ushida .................. G03F 7/2022
355/53
5,656,402 A * 8/1997 Kasuga ..................... G03F 9/70
356/399
(Continued)

FOREIGN PATENT DOCUMENTS

TW 200305292 10/2003
TW 201316135 4/2013
(Continued)

OTHER PUBLICATIONS

International Search Report and Written Opinion dated Nov. 17, 2016 in corresponding International Patent Application No. PCT/EP2016/066109.
(Continued)

*Primary Examiner* — Deoram Persaud
(74) *Attorney, Agent, or Firm* — Pillsbury Winthrop Shaw Pittman LLP

(57) ABSTRACT

A lithographic apparatus is described, the apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the apparatus further comprises an alignment system configured to perform, for one or more (Continued)

alignment marks that are present on the substrate: —a plurality of alignment mark position measurements for the alignment mark by applying a respective plurality of different alignment measurement parameters, thereby obtaining a plurality of measured alignment mark positions for the alignment mark; the apparatus further comprising a processing unit, the processing unit being configured to: —determine, for each of the plurality of alignment mark position measurements, a positional deviation as a difference between an expected alignment mark position and a measured alignment mark position, the measured alignment mark position being determined based on the respective alignment mark position measurement; —define a set of functions as possible causes for the positional deviations, the set of functions including a substrate deformation function representing a deformation of the substrate, and at least one mark deformation function representing a deformation of the one or more alignment marks; —generating a matrix equation PD=M*F whereby a vector PD comprising the positional deviations is set equal to a weighted combination, represented by a weight coefficient matrix M, of a vector F comprising the substrate deformation function and the at least one mark deformation function, whereby weight coefficients associated with the at least one mark deformation function vary depending on applied alignment measurement; —determining a value for the weight coefficients of the matrix M; —determining an inverse or pseudo-inverse matrix of the matrix M, thereby obtaining a value for the substrate deformation function as a weighted combination of the positional deviations. —applying the value of the substrate deformation function to perform an alignment of the target portion with the patterned radiation beam.

20 Claims, 6 Drawing Sheets

(52) U.S. Cl.
CPC .......... *G03F 9/7069* (2013.01); *G03F 9/7073* (2013.01); *G03F 9/7088* (2013.01)

(56) References Cited

U.S. PATENT DOCUMENTS

| 5,731,113 | A | * | 3/1998 | Ueno | G03F 7/70425 |
| --- | --- | --- | --- | --- | --- |
| | | | | | 356/399 |
| 5,877,861 | A | * | 3/1999 | Ausschnitt | G03F 7/70633 |
| | | | | | 356/401 |
| 7,198,964 | B1 | | 4/2007 | Cherry et al. | |
| 8,976,355 | B2 | * | 3/2015 | Van Der Sanden | |
| | | | | | G03F 7/70141 |
| | | | | | 356/401 |
| 8,982,347 | B2 | | 3/2015 | Wei et al. | |
| 9,360,769 | B2 | | 6/2016 | Kisteman et al. | |
| 2005/0002070 | A1 | * | 1/2005 | Nakaya | G03F 7/70433 |
| | | | | | 358/500 |
| 2005/0105071 | A1 | * | 5/2005 | Ishii | G03F 7/70291 |
| | | | | | 355/53 |
| 2005/0213806 | A1 | * | 9/2005 | Hanina | G03F 7/2051 |
| | | | | | 382/151 |
| 2006/0066649 | A1 | * | 3/2006 | Hirashima | B41J 3/28 |
| | | | | | 347/5 |
| 2010/0296074 | A1 | * | 11/2010 | Morita | G03F 7/70633 |
| | | | | | 355/77 |
| 2012/0083916 | A1 | * | 4/2012 | Yamada | G03F 7/70291 |
| | | | | | 700/105 |
| 2012/0218533 | A1 | * | 8/2012 | Lyulina | G03F 9/7003 |
| | | | | | 355/53 |
| 2013/0141723 | A1 | | 6/2013 | Wei et al. | |
| 2014/0185024 | A1 | | 7/2014 | Zellner et al. | |
| 2015/0192823 | A1 | * | 7/2015 | Fu | G03F 7/2022 |
| | | | | | 216/23 |
| 2015/0316490 | A1 | * | 11/2015 | Amit | G01N 21/8851 |
| | | | | | 356/400 |
| 2016/0246185 | A1 | * | 8/2016 | Ypma | G03F 7/70508 |
| 2018/0231900 | A1 | * | 8/2018 | Tinnemans | G03F 7/70633 |

FOREIGN PATENT DOCUMENTS

| WO | 2014/117791 | 8/2014 |
| --- | --- | --- |
| WO | 2015/031337 | 3/2015 |
| WO | 2015/049087 | 4/2015 |

OTHER PUBLICATIONS

Cherry, Gregory A., et al., "Multiblock Principal Component Analysis Based on a Combined Index for Semiconductor Fault Detection and Diagnosis," IEEE Transactions on Semiconductor Manufacturing, vol. 19, No. 2, pp. 159-172 (2006).

International Preliminary Report on Patentability dated Jan. 16, 2018 in corresponding International Patent Application No. PCT/EP2016/066109.

* cited by examiner (a)

(b)

(c)

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/066109, which was filed on Jul. 7, 2016, which claims priority of European patent application no. 15177117.7, which was filed on Jul. 16, 2015, and which is incorporated herein in its entirety by reference.

BACKGROUND

Field of the Invention

The present invention relates to a lithographic apparatus, and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, the integrated circuits as manufactured include a plurality of layers containing different patterns, each layer being generated using an exposure process as described above. In order to ensure proper operation of the integrated circuit that is manufactures, the layers as consecutively exposed need to be properly aligned to each other. In order to realize this, substrates are typically provided with a plurality of so-called alignment marks (also referred to as alignment targets), whereby a position of the alignment marks is used to determine or estimate a position of a previously exposed pattern. As such, prior to the exposure of a subsequent layer, the position of alignment marks is determined and used to determine a position of the pattern that was previously exposed. Typically, in order to determine the positions of such alignment marks, an alignment sensor is applied which may e.g. be configured to project a radiation beam onto an alignment mark or target and determine, based on a reflected radiation beam, a position of the alignment mark. Ideally, the measured position of the alignment mark would correspond to the actual position of the mark. However, various causes may result in a deviation between the measured position and the actual position of the alignment mark. In particular, a deformation of the alignment mark may result in the mentioned deviation. Such a deformation may e.g. be caused by the processing of the substrate outside the lithographic apparatus, such processing e.g. including etching and chemical mechanical polishing.

As a result, the subsequent layer may be projected or exposed on a position which is not in line, i.e. not aligned, with the previously exposed pattern, resulting in a so-called overlay error.

SUMMARY

It is desirable to provide in a measurement method for measuring a position of alignment marks on a substrate enabling a more accurate determination of an actual position of an alignment mark.

In a first aspect of the present invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the apparatus further comprises an alignment system configured to perform, for one or more alignment marks that are present on the substrate:

a plurality of alignment mark position measurements for the alignment mark by applying a respective plurality of different alignment measurement parameters, thereby obtaining a plurality of measured alignment mark positions for the alignment mark;

the apparatus further comprising a processing unit, the processing unit being configured to:

determine, for each of the plurality of alignment mark position measurements, a positional deviation as a difference between an expected alignment mark position and a measured alignment mark position, the measured alignment mark position being determined based on the respective alignment mark position measurement;

define a set of functions as possible causes for the positional deviations, the set of functions including a substrate deformation function representing a deformation of the substrate, and at least one mark deformation function representing a deformation of the one or more alignment marks;

generating a matrix equation $PD=M*F$ whereby a vector PD comprising the positional deviations is set equal to a weighted combination, represented by a weight coefficient matrix M, of a vector F comprising the substrate deformation function and the at least one mark deformation function, whereby weight coefficients associated with the at least one mark deformation function vary depending on applied alignment measurement;

determining a value for the weight coefficients of the matrix M;

determining an inverse or pseudo-inverse matrix of the matrix M, thereby obtaining a value for the substrate deformation function as a weighted combination of the positional deviations.

applying the value of the substrate deformation function to perform an alignment of the target portion with the patterned radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
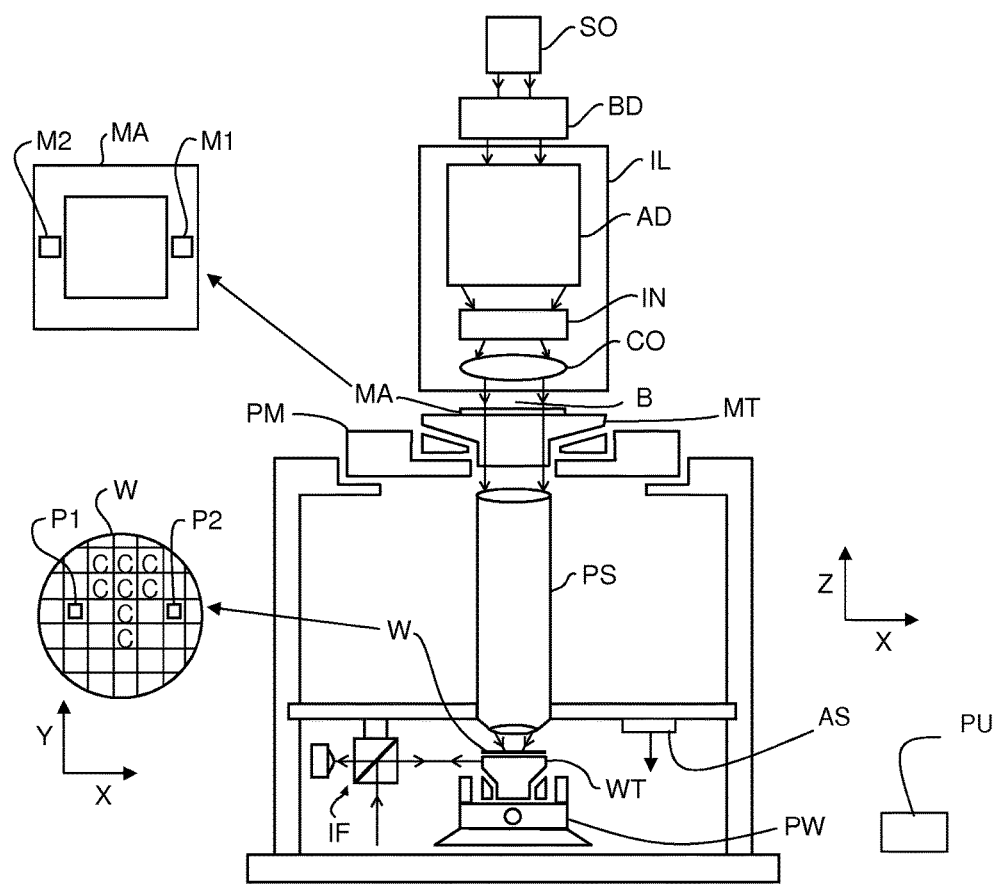
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In accordance with an embodiment of the present invention, the lithographic apparatus further comprises an alignment system AS configured to determine a position of one or more alignment marks that are present on a substrate.

In accordance with the present invention, the alignment system as applied is configured to perform a plurality of different alignment measurements, thereby obtaining a plurality of measured alignment mark positions for the alignment mark that is considered. Within the meaning of the present invention, performing different alignment measurements for a particular alignment mark means performing alignment measurement using different measurement parameters or characteristics. Such different measurement parameters or characteristics may e.g. include using different optical properties to perform the alignment measurement. As an example, the alignment system as applied in the lithographic apparatus according to the present invention may include an alignment projection system configured to project a plurality of alignment beams having different characteristics or parameters onto alignment mark positions on the substrate and a detection system configured to determine an alignment position based on a reflected beam off of the substrate.

Within the meaning of the present invention, different measurement parameters or characteristics as applied by the alignment system include at least a difference in polarization or a difference in frequency content of an alignment beam.

The alignment system according to the present invention, may thus determine, using the different measurement parameters or characteristics, (e.g. using alignment beams having a different color, i.e. frequency), a position of an alignment mark.

In general, the object of such alignment mark measurements as performed by the alignment system is to determine or estimate a position of the target portions (such as target portions C as shown in FIG. 1) of a next exposure process.

In order to determine these target portion positions, positions of alignment marks, that are e.g. provided in scribe-lanes surrounding the target portions, are measured. When the alignment mark positions as measured deviate from nominal or expected positions, one can assume that the target portions where the next exposure should take place, also have deviating positions. Using the measured positions of the alignment marks, one may determine or estimate the actual positions of the target portions, thus ensuring that the next exposure can performed at the appropriate position, thus aligning the next exposure to the target portion.

In case a measured alignment mark position deviates from an expected or nominal position, one would be inclined to attribute this to a deformation of the substrate. Such a deformation of the substrate may e.g. be caused by the various processes to which the substrate is submitted. When a plurality of measured alignment mark positions are available, and positional deviations, i.e. deviations of the expected alignment mark positions are determined, these deviations may e.g. be fitted to a function so as to describe the deformation of the substrate. This may e.g. be a two-dimensional function describing a deviation Δ(x,y) as a function of an (x,y) position. Using such a function, one may then determine or estimate an actual position of a target portion where a next layer or pattern needs to be projected.

In general, one would expect that a measured alignment mark position would not deviate, depending on the measurement characteristic that is used, e.g. the type of alignment beam that is applied.

However, it has been devised by the inventors that an alignment position measurement as performed by an alignment system may be disturbed by a deformation or asymmetry of the alignment mark itself. Phrased differently, due to a deformation of an alignment mark, a deviating alignment mark position measurement can be obtained, compared to a situation whereby the alignment mark is not deformed. In case no measures are taken, such deviating alignment mark position measurement could result in an erroneous determination of the alignment mark position. It has further been observed that this type of deviation, i.e. a deviating position measurement caused by an alignment mark deformation, depends on the measurement characteristic as applied.

As an example, when an alignment mark position is measured using different measurement characteristics, e.g. using alignment beams having a different frequency, this may lead to different results, i.e. different measured positions for the alignment marks.

As such, when a position of an alignment mark is measured using a plurality of different measurement characteristics, e.g. using alignment beams having a different frequency, different results are obtained, e.g. a plurality of different alignment mark positions may be obtained based on the measurements.

As will be clear from the above, the outcome of the alignment measurement procedure should be an assessment of the actual substrate deformation, i.e. an assessment of the actual positions of the alignment marks, which may then be used to determine an actual position of the target portions for a subsequent exposure.

In view of the effects described, in particular the effects of the alignment mark deformations, the measured alignment mark positions, i.e. the alignment mark positions as derived from the different measurements (i.e. using different measurement characteristics) are both affected by the actual (unknown) substrate deformation and by occurring (unknown) mark deformations. Both effects can lead to a deviation between an expected alignment mark position and a measured alignment mark position. As such, when a position deviation is observed, it may either be caused by an actual substrate deformation or by an alignment mark deformation or by a combination thereof.

Figure 2:
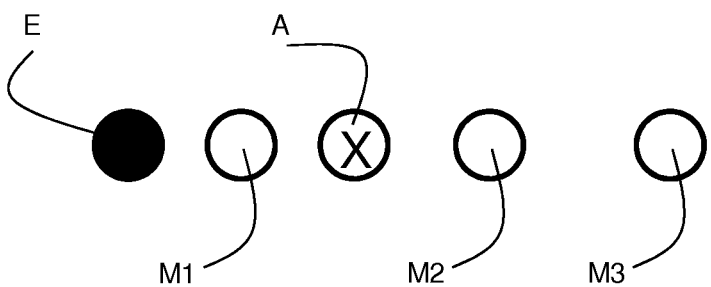
FIG. 2 depicts several possible alignment measurement results when applying different measurement parameters.
Figure 2:
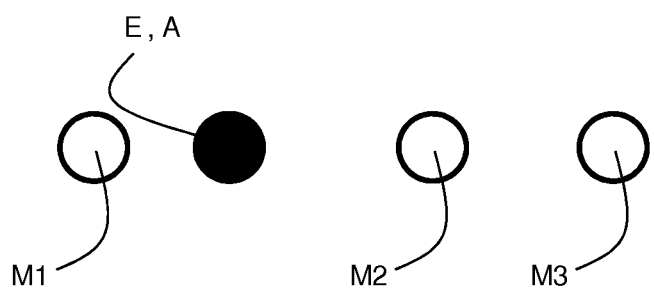
Figure 2:
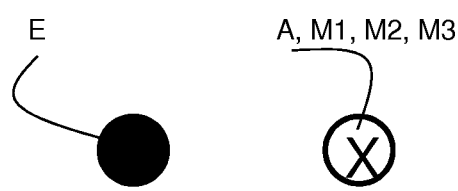

FIG. 2 schematically depicts some possible scenarios; Assuming that three measurements M1, M2, M3 are performed to determine a position of an alignment mark X. FIG. 2 (a) schematically shows the nominal or expected position E of the alignment mark and the measured positions M1, M2, M3. FIG. 2 (a) further shows the actual position A of the alignment mark. As can be seen, none of the measurements performed provide in an accurate representation of the actual position deviation (E-A)

The scenario as depicted in FIG. 2 (a) thus involves an actual displacement of an alignment mark (the actual alignment mark position A differs from the expected position E) combined with a mark deformation causing deviating measurements.

FIG. 2(b) shows an alternative scenario whereby differences are observed in the measurements (M1, M2, M3), the measured positions differing from the expected position E, while the actual position A is assumed to coincide with the expected position E. In this scenario, the measurements would imply that there is a positional deviation of the alignment mark, whereas, in reality, there is none, i.e. the position of the alignment mark is not affected by a substrate deformation.

FIG. 2 (c) schematically shows a third scenario whereby all three measurements M1, M2, M3 coincide and coincide with the actual position A. Such a scenario may occur when there is no alignment mark deformation affecting the measurements.

As will be clear from the various scenarios depicted, one needs be able to distinguish between the effects of a mark deformation and the effect of a substrate deformation, in order to arrive at a proper assessment of the actual alignment mark position.

The present invention provides in a method to realize such a separation of both effects. In an embodiment, the lithographic apparatus according to the invention may include a processing unit PU (see FIG. 1) to perform the required operations to separate both effects. Such a processing unit PU may therefore include a processor, microprocessor, computer or the like.

First of all, the present invention provides in a generalized formulation linking the alignment mark measurements to the different causes of alignment mark position deviations; deviations referring to the difference between a measured alignment mark position, i.e. an alignment mark position as derived from a measurement, and an actual alignment mark position.

As a generalized formulation, the present invention proposes to describe the positional deviations as observed (i.e. the differences between the measured alignment mark positions and the expected position) as a combination (e.g. a weighted combination) of a substrate deformation function and one or more mark deformation functions. These functions may e.g. be discrete functions, describing the effects of a substrate deformation or mark deformation as a function of the (expected) mark position.

The following nomenclature is hereby applied:
SD is used to denote a substrate deformation function;
MD is used to denote a mark deformation function;
PD refers to a positional deviation, i.e. the difference between an expected position of an alignment mark and a measured alignment mark position.
MC refers to a measurement parameter or characteristic as applied to measure an alignment mark position.

Using this nomenclature and assuming one substrate deformation function SD and two mark deformation functions MD1, MD2, the positional deviation of a particular mark m, which is provided on a particular substrate s, can be expressed, in an embodiment of the present invention, as:

$$PD(m,s,MC) = SD(m,s) + C_{1,MC} * MD1(m,s) + C_{2,MC} * MD2(m,s) \quad (1)$$

In equation (1), a positional deviation PD for a given mark m, on a substrate s as measured using a particular measurement characteristic MC is expressed as a weighted combination of the substrate deformation function SD and the mark deformation functions MD1 and MD2. Mark deformation functions MD1 and MD2 represent mark deformations and may be different for each mark m and substrate s. Further, as already indicated above, the effect of the mark deformation on the measurement of the alignment mark position may be different when different measurement conditions are applied. In equation 1, this is expressed by the weight coefficients $C_{1,MC}$ and $C_{2,MC}$. By doing so, the positional deviation PD for a given mark m on a substrate s may have different values, depending on the measurement characteristic MC that is used. As further can be seen in equation (1), a weight coefficient equal to 1 is applied to the substrate deformation function SD; by doing so, the substrate deformation function SD is assumed to describe (for a given mark m on a substrate s) an actual position deviation of the particular mark m.

As already mentioned above, such a substrate deformation may be caused by the various processes that are performed on a substrate, e.g. in between the exposure of two consecutive layers.

Figure 3:
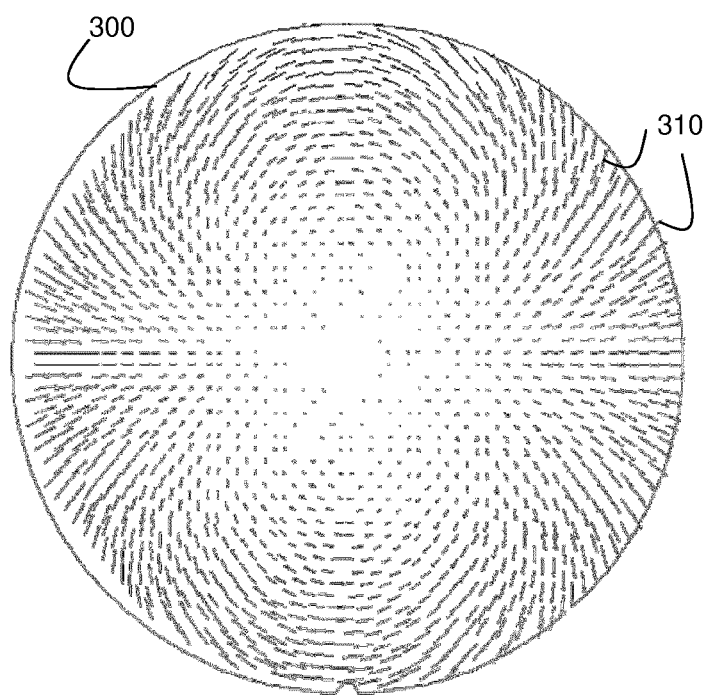
FIG. 3 depicts a possible substrate deformation.

FIG. 3 schematically shows a deformation pattern, which can be described by a two-dimensional substrate deformation function SD, as may be encountered in practice. In FIG. 3, a contour 300 of a substrate is schematically shown combined with a plurality of arrows 310 indicative of a deformation of the substrate at a particular position. Such particular deformation patterns may e.g. be caused by a non-uniform heating or cooling of a substrate.

Regarding the mark deformation functions MD1, MD2 (also referred to as mark deformations or mark asymmetries), these may e.g. represent particular types of deformations of a mark, e.g. a bottom portion of a mark being at an angle instead of being parallel to the plane of the substrate surface or e.g. one or more side walls of a mark being at an angle < >90 degrees. Such mark deformation functions are schematically shown in FIG. 4.

Figure 4:
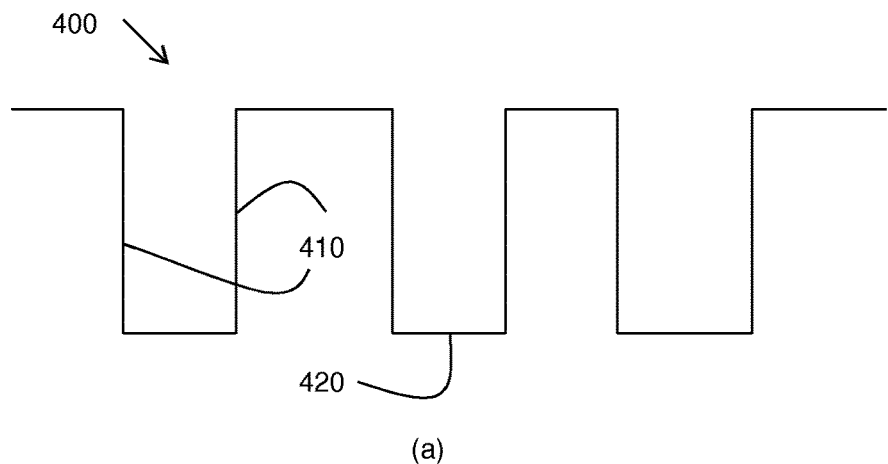
FIG. 4 depicts a cross-section an alignment mark and possible alignment mark deformations.
Figure 4:
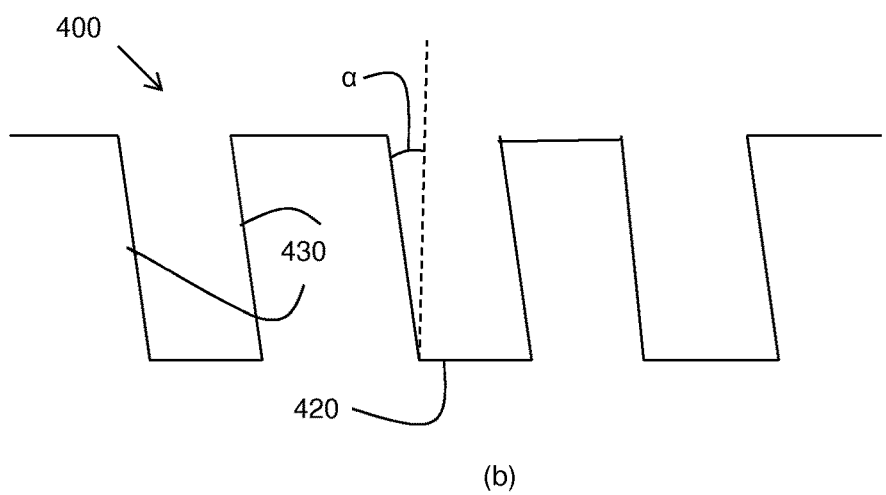
Figure 4:
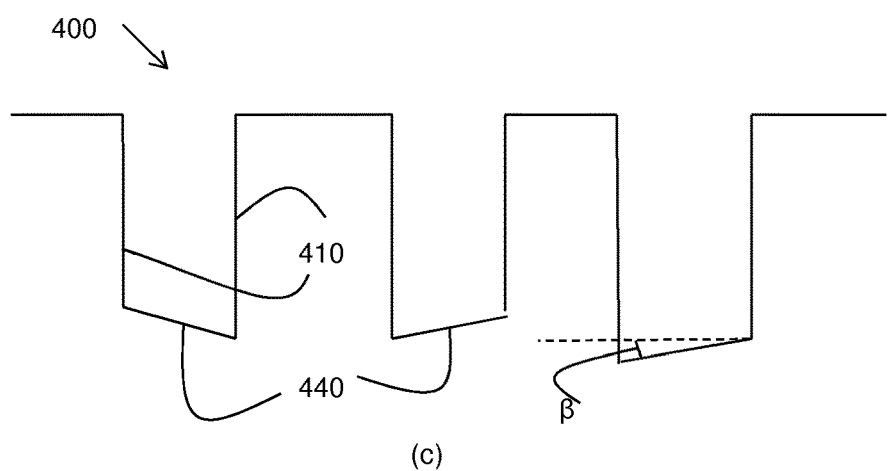

FIG. 4 schematically shows a cross-sectional view of (part of) an alignment mark 400.

FIG. 4 (*a*) schematically shows the alignment mark 400 without any deformations, i.e. having substantially vertical side walls 410 and a substantially horizontal bottom portion 420.

FIG. 4 (*b*) schematically shows the alignment mark 400 having slanted side walls 430. Such slanted side walls may be considered a mark deformation and may be described as a function, e.g. describing the actual angle of the side walls for each alignment mark.

FIG. 4 (*c*) schematically shows the alignment mark 400 having a tilted bottom portion 440. Such a tilted bottom portion may also be considered a mark deformation and may be described as a function, e.g. describing the actual tilt angle of the alignment mark.

FIGS. 4 (*b*) and 4 (*c*) thus illustrate two possible mark deformation functions which may have an effect on the mark position measurement.

Note that the mark deformation functions MD are thus functions describing actual physical deformations of the mark or marks on one or more substrates. The, initially unknown, weight coefficients $C_{1,MC}$ and $C_{2,MC}$ as shown in equation (1) thus describe the effect of a particular mark deformation on the mark position measurement. The weight coefficients $C_{1,MC}$ and $C_{2,MC}$ thus translate a particular deformation to a positional deviation.

As an example, a particular mark deformation function, e.g. mark deformation function MD1, may describe, for a given mark, the deformation by specifying a deformation angle, the deformation angle e.g. corresponding to the angle $\alpha$ or $\beta$ as indicated in FIG. 4. Weight coefficient $C_{1,MC}$ may then describe the positional deviation per unit deformation angle, for a particular measurement parameter or characteristic.

As mentioned above, a particular mark deformation, e.g. a mark deformation as illustrate in FIGS. 4 (*b*) and (*c*), may result in different alignment mark position measurements, depending on the measurement characteristic MC.

To further illustrate this, equation (1) can be expressed as the following set of equations, in case three different measurement characteristics MC are applied, the measurement characteristics referred to as 'red', 'green', 'blue':

$$PD(m, s, \text{red}) = SD(m, s) + C_{1,red}{}^*MD1(m, s) + C_{2,red}{}^*MD2(m, s) \quad (2)$$
$$PD(m, s, \text{green}) =$$
$$\qquad SD(m, s) + C_{1,green}{}^*MD1(m, s) + C_{2,green}{}^*MD2(m, s)$$
$$PD(m, s, \text{blue}) = SD(m, s) + C_{1,blue}{}^*MD1(m, s) + C_{2,blue}{}^*MD2(m, s)$$

or $$\begin{bmatrix} PD(m, s, \text{red}) \\ PD(m, s, \text{green}) \\ PD(m, s, \text{blue}) \end{bmatrix} = \begin{bmatrix} 1 & C_{1,red} & C_{2,red} \\ 1 & C_{1,green} & C_{2,green} \\ 1 & C_{1,blue} & C_{2,blue} \end{bmatrix} * \begin{bmatrix} SD(m, s) \\ MD1(m, s) \\ MD2(m, s) \end{bmatrix}, \quad (3)$$

$$PD = M^*F$$

As can further be noted, in the embodiment described, the substrate deformation function SD is assumed to be independent of the measurement characteristic used. In equation (3), the vector PD represents the known positional deviations (determined as the difference between the measured alignment mark position (i.e. the alignment mark position as derived from a particular alignment mark position measurement) and the expected or nominal alignment mark position, using the different measurement parameters or characteristics), vector F represents the, initially unknown, substrate and mark deformation functions and matrix M is referred to as an unknown weight coefficient matrix (also referred to as a mixing matrix) that describes how the different deformation functions contribute to the positional deviations of vector PD, matrix M comprising the aforementioned weight coefficients.

As a more general formulation, the positional deviations as derived for a particular mark m on a substrate s, by applying $N_{MC}$ different measurement characteristics MC, can be formulated as:

$$PD = M^*F; PD = \begin{bmatrix} PD(1) \\ \cdots \\ PD(N_{MC}) \end{bmatrix}, F = \begin{bmatrix} SD \\ MD(1) \\ \cdots \\ MD(N_{MD}) \end{bmatrix} \quad (4)$$

Wherein PD is a vector comprising the positional deviations PD(1) to PD($N_{MC}$), $N_{MC}$ being the number of measurement parameters or characteristics MC;

F is a vector comprising the substrate deformation function SD and the at least one mark deformation function MD(1) to MD($N_{MD}$), $N_{MD}$ being the number of mark deformations functions; and M represents a mixing matrix comprising weight coefficients m(i,j).

Equation (3), or the more general equation (4), thus describes, for a given alignment mark m that is present on a particular substrate s, a set of positional deviations (a positional deviation being a difference between an expected alignment mark position and a measured alignment mark position, the measured alignment mark position being determined based on an alignment mark position measurement), as an unknown weighted combination of a set of unknowns functions, the set of unknown functions including a substrate deformation function, representing a deformation of the substrate, and at least one mark deformation function, representing a deformation of the alignment marks.

In matrix form, a vector PD, comprising the set of positional deviations as derived from the alignment mark position measurements, is thus set equal to a matrix multiplication of an unknown mixing matrix M and a vector F comprising the set of unknown functions.

It is an object of the present invention to separate the actual substrate deformation and the effects caused by occurring mark deformations. In order to do so, equation (3), or the more general equation (4), needs to be solved to obtain an expression of the actual substrate deformation, which is represented by the substrate deformation function SD.

The present invention provides in several methods to realize this. Several of these methods comprise the following steps:

In a first step, the weight coefficients m(i,j) of the matrix M are determined;
In a second step, the inverse or pseudo-inverse $M^{-1}$ of the matrix M is determined. Once both steps are performed, equation (4) can be rewritten as:

$$M^{-1}*PD=F \quad (5)$$

Using equation (5), the substrate deformation SD may be expressed as a known weighted combination of the known positional deviations, the elements of the inverse or pseudo-inverse matrix $M^{-1}$ serving as weight coefficients.

In order to determine the weight coefficients of the matrix M, the present invention provides in various ways to realize this.

A first way to determine the weight coefficients of matrix M is to consider the equation to be solved (i.e. either equation (3) or (4)) as a blind source separation problem. Blind source separation (BSS) problems are known in literature and involve the separation of a set of source signals from a set of mixed observed signals, without having or having little knowledge of the source signals or the manner in which they are mixed. Blind source separation problems typically are heavily underdetermined. As such, in order to arrive at a desired solution, one or more conditions can be set, conditions which the solution has to fulfill, thus restricting the number of possible solutions.

Known methods of solving such a BSS problem may e.g. be based on a so-called principal component analysis (PCA) or an independent component analysis (ICA). Both PCA and ICA pose different conditions to the solutions, thus restricting the possible solutions. When solving a BSS problem using PCA, the basic idea is to find mixing matrix coefficients and corresponding signal components whereby the signal components are selected such that the first principal component has the largest possible variance (that is, accounts for as much of the variability in the data as possible), and each succeeding component in turn has the highest variance possible under the constraint that it is orthogonal to (i.e., uncorrelated with) the preceding components. Using these constraints, the PCA is essentially equal to a singular value decomposition. In order for the PCA to come to a unique solution, the following assumptions are implicitly made:

Signal components are orthogonal, i.e. uncorrelated;
The columns of the mixing matrix M are orthogonal;

It has been devised by the inventors that, although the first assumption may be true, the second assumption is very unlikely. As such, in order to solve the problem of separating the effect of the substrate deformation and the mark deformation effects as described above, PCA may not be the preferred way of solving equation (3) or (4).

As an alternative to the principal component analysis, blind source separation problems or the like may also be solved by means of a so-called independent component analysis (ICA). Using ICA as a tool to determine the weight coefficient matrix or mixing matrix M also implies certain assumptions:

The signal components are statistically independent;
The signal components are non-Gaussian distributed.

In view of the aforementioned problem to be solved, the inventors have devised that the signal components may be statistically independent and that the signal components are probably non-Gaussian distributed.

As such, in an embodiment of the present invention, ICA is applied to solve equation (3) or (4), in particular to determine the weight coefficients of the mixing matrix M.

In order to apply the ICA, a comparatively large number of measurements, also referred to as known mixtures, need to be available. Therefore, in order to apply the ICA, alignment measurements need to be performed for a plurality of alignment marks. In general, this does not cause a problem because typically a comparatively large number of alignment marks are available on a substrate and are subjected to measurements, in order to obtain an accurate assessment of the actual substrate deformation.

Further, in order to improved the robustness of the ICA, alignment mark position measurements of multiple substrates may be used.

In an embodiment of the present invention which applies ICA to determine the weight coefficients of the weight coefficient matrix M, additional constraints or conditions are applied, which provide in a more accurate determination of the weight coefficients (such embodiments applying a constraint or conditioned ICA are abbreviated as cICA methods or embodiments): In the general formulation of the equation to be solved, i.e. equation (4), the mixing matrix M is a ($N_{MC} \times N_{MD}+1$) matrix ($N_{MC}$ being the number of measurement characteristics MC as applied, $N_{MD}$ being the number of mark deformation functions and assuming one substrate deformation function), each weight coefficient or matrix element being unknown.

However, as described above, the actual substrate deformation (e.g. described by the substrate deformation function SD) can be assumed to be independent of the measurement characteristic MC as applied. Phrased differently, all weight coefficients of the column of the mixing matrix M that is associated with the substrate deformation function (e.g. column 1 in the mixing matrix M of equation (3)) are found to be equal to 1. When applying this additional constraint or condition, the remaining weight coefficients may be determined by means of ICA. Using this approach, it has been observed that a more accurate separation of the substrate deformation function and the mark deformation function or functions can be realized. In this respect, it should be noted that other blind source separation algorithms may be considered as well, as an alternative to the cICA method as described.

A second way to determine the weight coefficients of the mixing matrix M is by means of simulations using so-called stack information. Within the meaning of the present invention, stack refers to the set of layers that is applied on a substrate, said layers having different optical or electromagnetic properties, e.g. due to the use of different materials.

When the geometry of the alignment mark that is measured is known, combined with optical and geometric data describing the stack or parts of the stack, the effects of certain alignment mark deformations (such as e.g. the deformations as shown in FIGS. 4 (b) and 4 (c)) may be simulated, thus providing in a value for the weight coefficients that are associated with the mark deformation functions.

Figure 5:
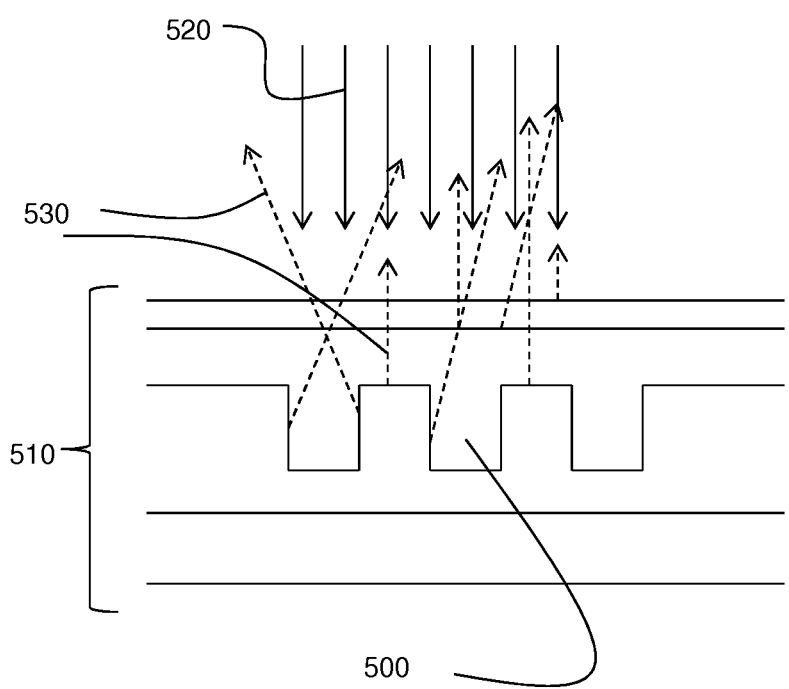
FIG. 5 depicts a simulation model of part of a stack of a substrate.

FIG. 5 schematically shows a cross-sectional view of part of a stack of layers 510, one of said layers containing an alignment mark 500.

In order to obtain a value for the weight coefficients associated with the mark deformation functions, the following steps may thus be performed:

Generating a model representing at least part of the applied stack, the model including the alignment mark and a mark deformation (not shown in FIG. 5);

Simulating the response of the stack when a particular beam (e.g. having a particular optical properties) is projected onto the stack;

Determining one or more weight coefficients based on the response and the applied mark deformation.

As an example, simulations may be performed to assess the response of the depicted stack 510 to a radiation beam 520, e.g. a radiation beam suitable to perform an alignment measurement. Depending on the optical properties of the radiation beam (e.g. the frequency or frequency content), the projection of the radiation beam 520 may result in a particular response, i.e. a particular reflected beam 530 or set of beams. This particular response 530 may at least partly be effected by the mark deformation that is applied in the model.

By comparing the response 530 to a response to the radiation beam 520 when no mark deformation is modelled, the effect of the deformation can be quantified, providing a value of one of the weight coefficients of the mixing matrix M. By repeating the described steps for various different radiation beams, i.e. corresponding to the use of different measurement characteristics or parameters, the weight coefficients associated with a particular mark deformation can be determined for a plurality of measurement characteristics, thus providing in values for the weight coefficients in a particular column of the mixing matrix M.

As such, by means of simulations, the weight coefficients associated with the one or more mark deformation functions (i.e. the weight coefficients in columns 2 to $N_{MD}+1$ in equation (4)) can be determined by means of simulations.

Further, as already indicated above, the weight coefficients associated with the substrate deformation function SD (i.e. the weight coefficients in column 1 of the matrix M of equation (4)) may be set equal to 1.

An alternative is to determine weight coefficients of the inverse or pseudo-inverse matrix $M^{-1}$ in equation (5) using overlay data from previous substrates that have undergone a process same as or similar to the process that the substrate of which the substrate deformation is to be determined is undergoing. Since these data are not available for the substrate of which the substrate deformation is to be determined, the overlay data from the previous substrates may be used in combination with the alignment mark position measurements performed in accordance with the invention in order to determine the weight coefficients of the mixing matrix M.

Equation 5 may become $$F = M^{-1} * PD = N * PD \qquad (5)$$

in which N is defined as the inverse or pseudo-inverse matrix of M in equation (4).

The overlay data may include, but are not limited to displacement in a direction perpendicular to the radiation beam patterning the target portion of the substrate.

Once the weight coefficients m(i,j) of the mixing matrix M are determined, the inverse or pseudo-inverse matrix $M^{-1}$ needs to be determined.

In case the columns of the mixing matrix M are independent of each other, it can be shown that the pseudo-inverse matrix of the mixing matrix M provides in a decomposition matrix that decomposes the alignment measurements into a substrate deformation can be isolated from the mark deformations.

It has further been devised by the inventors that it may not be required that all columns of the mixing matrix M are independent of each other.

It may be sufficient, in order to separate the substrate deformation from the mark deformation, that the column of matrix M that is associated with the substrate deformation function is independent from the other columns, the other columns being associated with the one or more mark deformation functions.

In such case, it may not be possible to obtain an accurate separation of the mark deformation functions. However, since the object of the invention is to separate the actual substrate deformation from the effects of the mark deformations, an actual separation of the individual mark deformation functions is not required.

In case the column of the mixing matrix M that is associated with the substrate deformation function is dependent from the other columns, it is not possible to separate the substrate deformation from the mark deformation.

In case such a dependency is noticed, it may be alleviated by taking any of the following measures;

Increase the number of alignment measurements per alignment mark using additional different measurement parameters or characteristics. As an example, in case performing alignment measurements using two alignment beams having a different color would be insufficient, it may be advantageous to add a third measurement using an alignment beam having yet another color. By doing so, the columns of the mixing matrix M may become more linearly independent. In a similar manner, applying additional measurements using a different polarization state of the alignment beam may be beneficial as well.

Perform more specific alignment measurements, in particular asymmetry measurements.

Within the meaning of the present invention, asymmetry measurements refers to particular additional measurements that are performed during an alignment measurement.

Figure 6:
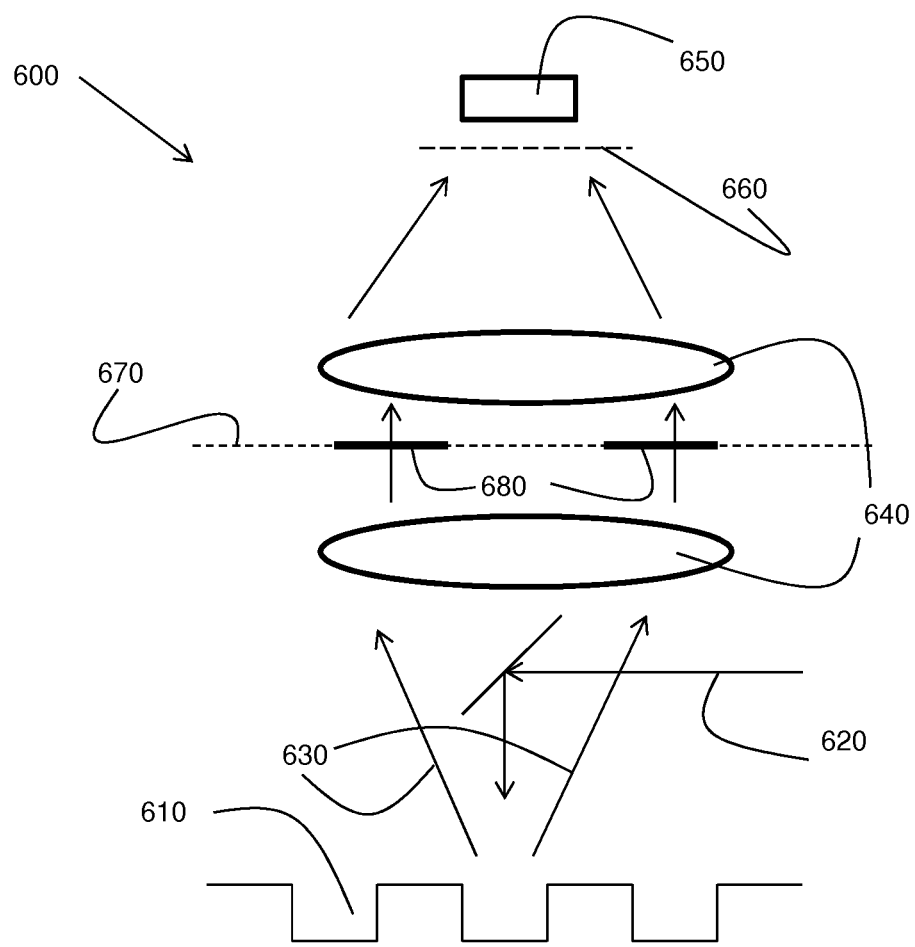
FIG. 6 depicts an alignment system enabling asymmetrical measurements.

FIG. 6 schematically illustrates such an alignment measurement. FIG. 6 schematically shows an alignment system 600 configured to determine a position of an alignment mark 610, by projecting an alignment beam 620 onto the alignment mark 610. The reflected beam or beams 630 are subsequently provided, via a lens system 640 to a detector 650, e.g. via a grating 660 or the like. Based on the intensity as detected by the detector 650, a relative position of the alignment mark 610 and the grating 660 or detector 650 of the alignment system 600.

This relative position as determined may then be used to determine the positional deviations PD as e.g. applied in matrix equations (3) or (4). FIG. 6 further schematically shows a pupil plane 670 of the lens system 630 and two locations 680 at which an intensity of the reflected beam or beams 630 can be measured. In an embodiment, the locations may be selected to enable measurement of the −1 and +1 order of the reflected beam 630.

It has been observed by the inventors that, in case the alignment mark 610 as measured is deformed, e.g. comprising a deformation as shown in FIGS. 4 (b) 4 (c), an asymmetry may be observed between the intensity as measured at the different locations, e.g. locations 680, in the pupil plane. Such asymmetry measurement, e.g. providing in a difference between an observed intensity of a +1 reflected order and a −1 reflected order, provides in additional information regarding the occurring mark deformations.

In particular, in an embodiment of the present invention, such asymmetry measurements are included in the matrix equations (3) or (4). As with the positional deviations PD, an asymmetry measurement, or an observed asymmetry in intensity in the pupil plane of the alignment system, can be considered to be caused by a weighed combination or mixture of different occurring mark deformations. Starting from equation (3), and assuming that for each color red, green, blue an asymmetry measurement is available, the asymmetry measurements, referred to as AM, may be included as follows:

$$\begin{bmatrix} PD(m, s, \text{red}) \\ PD(m, s, \text{green}) \\ PD(m, s, \text{blue}) \\ AM(m, s, \text{red}) \\ AM(m, s, \text{green}) \\ AM(m, s, \text{blue}) \end{bmatrix} = \begin{bmatrix} 1 & C_{1,red} & C_{2,red} \\ 1 & C_{1,green} & C_{2,green} \\ 1 & C_{1,blue} & C_{2,blue} \\ 0 & am_{1,red} & am_{2,red} \\ 0 & am_{1,green} & am_{2,green} \\ 0 & am_{1,blue} & am_{2,blue} \end{bmatrix} * \begin{bmatrix} SD \\ MD1 \\ MD2 \end{bmatrix}, \quad (6)$$

Compared to equation (3), the asymmetry measurements AM have been included as a weighted combination, using weight coefficients am(i,j) of the mark deformation functions MD1 and MD2. Note that, as already indicated above, it is considered that the substrate deformation SD does not contribute to the asymmetry as perceived in the pupil plane of the alignment system 600. Therefore, the weight coefficients associated with the substrate deformation function SD as set to zero for the asymmetric measurements AM.

In a similar manner as described above, the weight coefficients of the expanded matrix of equation (6) may be determined by considering the equation as representing a blind source separation problem, which can e.g. be solved using independent component analysis ICA. As can be seen from equation (6), by setting the weight factors associated with the substrate deformation function SD for the asymmetric measurements AM to zero, additional constraints are applied which may facilitate determining the weight coefficients using ICA.

It is further worth noting that the weight coefficients am(i,j) may also be determined by means of simulations, in a similar manner as described above with respect to the weight coefficients m(i,j).

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the apparatus further comprises an alignment system configured to perform, for one or more alignment marks that are present on the substrate: a plurality of alignment mark position measurements for the alignment mark by applying a respective plurality of different alignment measurement parameters, thereby obtaining a plurality of measured alignment mark positions for the alignment mark; the apparatus further comprising a processing unit, the processing unit being configured to: —determine, for each of the plurality of alignment mark position measurements, a positional deviation as a difference between an expected alignment mark position and a measured alignment mark position, the measured alignment mark position being determined based on the respective alignment mark position measurement; —define a set of functions as possible causes for the positional deviations, the set of functions including a substrate deformation function representing a deformation of the substrate, and at least one mark deformation function representing a deformation of the one or more alignment marks; —generate a matrix equation PD=M*F whereby a vector PD comprising the positional deviations is set equal to a weighted combination, represented by a weight coefficient matrix M, of a vector F comprising the substrate deformation function and the at least one mark deformation function, whereby weight coefficients associated with the at least one mark deformation function vary depending on applied alignment measurement; —determine a value for the weight coefficients of the matrix M; —determine an inverse or pseudo-inverse matrix of the matrix M, thereby obtaining a value for the substrate deformation function as a weighted combination of the positional deviations; —apply the value of the substrate deformation function to perform an alignment of the target portion with the patterned radiation beam.

In an embodiment, $$PD = \begin{bmatrix} pd(1) \\ \dots \\ pd(N_{MC}) \end{bmatrix}, F = \begin{bmatrix} SD \\ MD(1) \\ \dots \\ MD(N_{MD}) \end{bmatrix}$$

wherein: PD is a vector comprising the positional deviations pd(1)-pd(NMC), NMC being the number of different alignment measurements; F is a vector comprising the substrate deformation function SD and the at least one mark deformation function MD(1)-MD(NMD), NMD being the number of mark deformations functions; M is the weight coefficient matrix comprising weight coefficients m(i,j). In an embodiment, the plurality of different alignment measurements are performed by applying alignment measurement beams having different optical properties. In an embodiment, the different optical properties of the alignment beams include different polarizations or different frequencies. In an embodiment, the weight coefficients are determined by mean of ICA, independent component analysis. In an embodiment, the weight coefficients of the mixing matrix M that are associated with the substrate deformation function SD are set equal to a constant value. In an embodiment, the constant value is 1. In an embodiment, the weight coefficients are determined based on simulations. In an embodiment, the simulations comprise: generating a model representing at least part of a stack of the substrate, the part including an alignment mark and a mark deformation; simulating a response of the stack to an alignment mark position measurement applying an alignment measurement parameter; determining one or more weight coefficients of the mixing matrix M, based on the response and the mark deformation that is represented in the model. In an embodiment, the alignment system is further configured to provide, for each of the plurality of alignment mark position measurement, an asymmetry measurement, the processing unit being configured to include the asymmetry measurements into the matrix equation, thereby including the asymmetry measurements into the vector PD, the asymmetry measurements being set equal to a weighted combination of the one or more mark deformation functions of the vector F.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the apparatus further comprises an alignment system configured to perform, for one or more alignment marks that are present on the substrate: a plurality of alignment mark position measurements for the alignment mark by applying a respective plurality of different alignment measurement parameters, thereby obtaining a plurality of measured alignment mark positions for the alignment mark; the apparatus further comprising a processing unit, the processing unit being configured to: determine, for each of the plurality of alignment mark position measurements, a positional deviation as a difference between an expected alignment mark position and a measured alignment mark position, the measured alignment mark position being determined based on the respective alignment mark position measurement; define a set of functions as possible causes for the positional deviations, the set of functions including a substrate deformation function representing a deformation of the substrate, and at least one mark deformation function representing a deformation of the one or more alignment marks; generating a matrix equation F=N*PD whereby a vector F is set equal to a weighted combination, represented by a weight coefficient matrix N, of a vector PD comprising the positional deviations, the vector F comprising the substrate deformation function and the at least one mark deformation function, whereby weight coefficients associated with the at least one mark deformation function vary depending on applied alignment measurement; determining a value for the weight coefficients of the matrix N, thereby obtaining a value for the substrate deformation function as a weighted combination of the positional deviations; applying the value of the substrate deformation function to perform an alignment of the target portion with the patterned radiation beam.

In an embodiment, overlay data from one or more previous substrates that have undergone a process similar to or the same as the process that the substrate for which the substrate deformation is to be determined is undergoing and the alignment mark position measurements are used to determine the value for the weight coefficients of the matrix M.

In an embodiment, there is provided a device manufacturing method comprising: aligning a target portion of a substrate and a patterned beam of radiation using a lithographic apparatus as described herein; and projecting the patterned beam of radiation onto the target portion of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a projection system configured to project a patterned radiation beam onto a target portion of a substrate;
   an alignment system configured to perform, for each of one or more alignment marks that are present on the substrate, a plurality of alignment mark position measurements for the alignment mark by applying a respective plurality of different alignment measurement parameters, to obtain a plurality of measured alignment mark positions for the alignment mark; and a processing unit configured to:
determine, for each of the plurality of alignment mark position measurements, a positional deviation as a difference between an expected alignment mark position and a measured alignment mark position, the measured alignment mark position being determined based on the respective alignment mark position measurement;
define a set of functions as possible causes for the positional deviations, the set of functions including a substrate deformation function representing a deformation of the substrate, and at least one mark deformation function representing a deformation of the one or more alignment marks;
generate a matrix equation PD=M*F wherein a vector PD comprising the positional deviations is set equal to a weighted combination, represented by a weight coefficient matrix M, of a vector F comprising the substrate deformation function and the at least one mark deformation function, wherein weight coefficients associated with the at least one mark deformation function vary depending on applied alignment measurement;
determine a value for the weight coefficients of the matrix M;
determine an inverse or pseudo-inverse matrix of the matrix M to obtain a value for the substrate deformation function as a weighted combination of the positional deviations; and
apply the value of the substrate deformation function to perform an alignment of the target portion with the patterned radiation beam.

2. The lithographic apparatus according to claim 1, wherein $$PD = \begin{bmatrix} pd(1) \\ \cdots \\ pd(N_{MC}) \end{bmatrix}, F = \begin{bmatrix} SD \\ MD(1) \\ \cdots \\ MD(N_{MD}) \end{bmatrix}$$

wherein:
PD is a vector comprising the positional deviations pd(1)-pd($N_{MC}$), $N_{MC}$ being the number of different alignment measurements;
F is a vector comprising the substrate deformation function SD and the at least one mark deformation function MD(1)-MD($N_{MD}$), $N_{MD}$ being the number of mark deformations functions; and
M is the weight coefficient matrix comprising weight coefficients m(i,j).

3. The lithographic apparatus according to claim 1, wherein the plurality of different alignment measurements are performed by applying alignment measurement beams having different optical properties.

4. The lithographic apparatus according to claim 3, wherein the different optical properties of the alignment beams include different polarizations or different frequencies.

5. The lithographic apparatus according to claim 1, wherein the weight coefficients are determined by means of independent component analysis.

6. The lithographic apparatus according to claim 5, wherein the weight coefficients of the matrix M that are associated with the substrate deformation function SD are set equal to a constant value.

7. The lithographic apparatus according to claim 6, wherein the constant value is 1.

8. The lithographic apparatus according to claim 1, wherein the weight coefficients are determined based on a simulation.

9. The lithographic apparatus according to claim 8, wherein the simulation comprises:
generation of model representing at least part of a stack of the substrate, the part including an alignment mark and a mark deformation; and
simulation of a response of the stack to an alignment mark position measurement applying an alignment measurement parameter; and
determination of one or more weight coefficients of the matrix M, based on the response and the mark deformation that is represented in the model.

10. The lithographic apparatus according to claim 1, wherein the alignment system is further configured to provide, for each of the plurality of alignment mark position measurement, an asymmetry measurement, the processing unit being configured to include the asymmetry measurements into the matrix equation, thereby including the asymmetry measurements into the vector PD, the asymmetry measurements being set equal to a weighted combination of the one or more mark deformation functions of the vector F.

11. A device manufacturing method comprising:
aligning a target portion of a substrate and a patterned beam of radiation using a lithographic apparatus according to claim 1; and
projecting the patterned beam of radiation onto the target portion of the substrate.

12. A lithographic apparatus comprising:
a projection system configured to project a patterned radiation beam onto a target portion of the substrate;
an alignment system configured to perform, for each of one or more alignment marks that are present on the substrate, a plurality of alignment mark position measurements for the alignment mark by applying a respective plurality of different alignment measurement parameters, to obtain a plurality of measured alignment mark positions for the alignment mark; and
a processing unit configured to:
determine, for each of the plurality of alignment mark position measurements, a positional deviation as a difference between an expected alignment mark position and a measured alignment mark position, the measured alignment mark position being determined based on the respective alignment mark position measurement;
define a set of functions as possible causes for the positional deviations, the set of functions including a substrate deformation function representing a deformation of the substrate, and at least one mark deformation function representing a deformation of the one or more alignment marks;
generate a matrix equation F=N*PD wherein a vector F is set equal to a weighted combination, represented by a weight coefficient matrix N, of a vector PD comprising the positional deviations, the vector F comprising the substrate deformation function and the at least one mark deformation function, wherein weight coefficients associated with the at least one mark deformation function vary depending on applied alignment measurement;

determine a value for the weight coefficients of the matrix N, to obtain a value for the substrate deformation function as a weighted combination of the positional deviations; and apply the value of the substrate deformation function to perform an alignment of the target portion with the patterned radiation beam.

13. The lithographic apparatus according to claim 12, wherein overlay data from one or more previous substrates that have undergone a process similar to or the same as the process that the substrate for which the substrate deformation is to be determined is undergoing and the alignment mark position measurements are used to determine the value for the weight coefficients of the matrix M.

14. A device manufacturing method comprising:
aligning a target portion of a substrate and a patterned beam of radiation using a lithographic apparatus according to claim 12; and
projecting the patterned beam of radiation onto the target portion of the substrate.

15. A non-transitory computer-readable medium comprising instructions configured to cause a computer system to at least:
obtain, for each of a plurality of alignment mark position measurements, a positional deviation as a difference between an expected alignment mark position and a measured alignment mark position, the measured alignment mark position being determined based on the respective alignment mark position measurement, wherein the plurality of measured alignment mark positions comprise, for each of one or more alignment marks that are present on a substrate, a plurality of alignment mark position measurements for the alignment mark obtained by application of a respective plurality of different alignment measurement parameters;
define a set of functions as possible causes for the positional deviations, the set of functions including a substrate deformation function representing a deformation of the substrate, and at least one mark deformation function representing a deformation of the one or more alignment marks;
(a) generate a matrix equation $PD1=M*F1$ wherein a vector PD1 comprising the positional deviations is set equal to a weighted combination, represented by a weight coefficient matrix M, of a vector F1 comprising the substrate deformation function and the at least one mark deformation function, wherein weight coefficients associated with the at least one mark deformation function vary depending on applied alignment measurement, determine a value for the weight coefficients of the matrix M, and determine an inverse or pseudo-inverse matrix of the matrix M to obtain a value for the substrate deformation function as a weighted combination of the positional deviations, or (b) generate a matrix equation $F2=N*PD2$ wherein a vector F2 is set equal to a weighted combination, represented by a weight coefficient matrix N, of a vector PD2 comprising the positional deviations, the vector F2 comprising the substrate deformation function and the at least one mark deformation function, wherein weight coefficients associated with the at least one mark deformation function vary depending on applied alignment measurement, determine a value for the weight coefficients of the matrix N, to obtain a value for the substrate deformation function as a weighted combination of the positional deviations; and cause application of the value of the substrate deformation function to perform an alignment of the target portion with the patterned radiation beam.

16. The computer-readable medium of claim 15, wherein the instructions are configured to cause the computer system to generate the matrix equation $PD1=M*F1$ wherein the vector PD1 comprising the positional deviations is set equal to the weighted combination, represented by the weight coefficient matrix M, of the vector F1 comprising the substrate deformation function and the at least one mark deformation function, wherein weight coefficients associated with the at least one mark deformation function vary depending on applied alignment measurement, determine the value for the weight coefficients of the matrix M, and determine the inverse or pseudo-inverse matrix of the matrix M to obtain the value for the substrate deformation function as the weighted combination of the positional deviations.

17. The computer-readable medium of claim 15, wherein the instructions are configured to cause the computer system to generate the matrix equation $F2=N*PD2$ wherein the vector F2 is set equal to the weighted combination, represented by the weight coefficient matrix N, of the vector PD2 comprising the positional deviations, the vector F2 comprising the substrate deformation function and the at least one mark deformation function, wherein weight coefficients associated with the at least one mark deformation function vary depending on applied alignment measurement, determine the value for the weight coefficients of the matrix N, to obtain the value for the substrate deformation function as a weighted combination of the positional deviations.

18. The computer-readable medium of claim 15, wherein the plurality of different alignment measurements are obtained by application of alignment measurement beams having different optical properties.

19. The computer-readable medium of claim 15, wherein the instructions are configured to cause the computer system to determine the weight coefficients by means of independent component analysis.

20. The computer-readable medium of claim 15, wherein the instructions are configured to cause the computer system to determine the weight coefficients based on a simulation.

* * * * *